United States Patent
Kammler et al.

(10) Patent No.: US 7,223,662 B2
(45) Date of Patent: May 29, 2007

(54) METHOD OF FORMING AN EPITAXIAL LAYER FOR RAISED DRAIN AND SOURCE REGIONS BY REMOVING SURFACE DEFECTS OF THE INITIAL CRYSTAL SURFACE

(75) Inventors: Thorsten Kammler, Ottendorf-Okrilla (DE); Scott Luning, Poughkeepsie, NY (US); Linda Black, Wappingers Falls, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 188 days.

(21) Appl. No.: 11/082,122

(22) Filed: Mar. 16, 2005

(65) Prior Publication Data

US 2006/0003533 A1    Jan. 5, 2006

(30) Foreign Application Priority Data

Jun. 30, 2004    (DE) .................... 10 2004 031 743

(51) Int. Cl.
*H01L 21/336*    (2006.01)
*H01L 21/44*    (2006.01)
*H01L 21/302*    (2006.01)
*H01L 21/461*    (2006.01)

(52) U.S. Cl. ............ 438/300; 438/607; 438/682; 438/683; 438/649; 438/738; 257/E21.165; 257/E21.43; 257/E21.129; 257/E21.431; 257/E21.438

(58) Field of Classification Search ............... 438/300, 438/607, 683, 738, 682, 649; 257/E21.165, 257/E21.43, E21.129, E21.431, E21.438
See application file for complete search history.

(56) References Cited

U.S. PATENT DOCUMENTS

| | | | | |
|---|---|---|---|---|
| 5,851,891 A | * | 12/1998 | Dawson et al. | 438/305 |
| 5,994,191 A | * | 11/1999 | Xiang et al. | 438/300 |
| 6,165,902 A | * | 12/2000 | Pramanick et al. | 438/653 |
| 6,372,644 B1 | * | 4/2002 | Foster et al. | 438/682 |
| 6,399,450 B1 | | 6/2002 | Yu | 438/300 |
| 6,403,433 B1 | * | 6/2002 | Yu et al. | 438/300 |
| 2005/0079692 A1 | * | 4/2005 | Samoilov et al. | 438/481 |
| 2005/0170594 A1 | * | 8/2005 | Yeo et al. | 438/300 |
| 2006/0003533 A1 | * | 1/2006 | Kammler et al. | 438/300 |
| 2006/0094196 A1 | * | 5/2006 | Kim | 438/305 |

* cited by examiner

*Primary Examiner*—Walter L. Lindsay, Jr.
(74) *Attorney, Agent, or Firm*—Williams, Morgan & Amerson, P.C.

(57) ABSTRACT

By substantially amorphizing a selectively epitaxially grown silicon layer used for forming a raised drain and source region and a portion of the underlying substrate, or just the surface region of the substrate (prior to growing the silicon overlayer), the number of interface defects located between the grown silicon layer and the initial substrate surface may be significantly reduced. Consequently, deleterious effects such as charge carrier gettering or creating diffusion paths for dopants may be suppressed.

19 Claims, 6 Drawing Sheets

METHOD OF FORMING AN EPITAXIAL LAYER FOR RAISED DRAIN AND SOURCE REGIONS BY REMOVING SURFACE DEFECTS OF THE INITIAL CRYSTAL SURFACE

BACKGROUND OF THE INVENTION

1. Field of the Invention

The present invention generally relates to the fabrication of integrated circuits, and, more particularly, to the formation of raised drain and source regions by means of epitaxial growth.

2. Description of the Related Art

Presently, critical feature sizes of circuit elements of sophisticated integrated circuits are approaching 0.1 μm and less, wherein, in the field of MOS production, one important design dimension in this respect is the gate length of corresponding field effect transistor elements. A field effect transistor comprises a gate electrode formed on a gate insulation layer that electrically insulates the gate electrode from a channel region, yet also provides a required capacitive coupling to enable the proper control of the channel formation that is initiated upon applying an appropriate control voltage to the gate electrode. The channel region connects two heavily doped regions, which are referred to as a source region and a drain region, that form the required PN junction, wherein a distance between the drain and source region is denoted as "channel length." The channel length roughly corresponds to the gate length, as the gate electrode is used in the presently preferred MOS technology as an implantation mask to form the drain and source regions in a self-aligned manner.

The demand for fast operating integrated MOS circuits, or any other integrated circuits, requires the reduction in size of the involved circuit elements, especially of the field effect transistors, as these transistor elements are usually operated in a switched mode wherein the switching speed is significantly determined by parasitic capacitances and parasitic resistances of the transistor elements and interconnect lines. By reducing, for instance, the channel length and thus the gate length of the transistor elements, a significant improvement with respect to signal processing performance may be obtained along with other advantages, such as increased packing density and thus increased functionality of the integrated circuit with a reduced chip area. The steady decrease of the transistor dimensions, however, entails a plurality of issues that have to be dealt with to not unduly offset the advantages achieved by the size reduction of the circuit elements. For instance, the reduced feature sizes may also lead to reduced cross-sectional areas of lines and contact regions, thereby requiring increased dopant concentrations or other measures to maintain a required conductivity. Another issue arises from the fact that, as a general rule, a reduced gate length of a transistor also requires a reduced thickness of the gate insulation layer and shallow dopant profiles of the drain and source regions to provide the required controllability of the inversion channel.

Figure 1A:
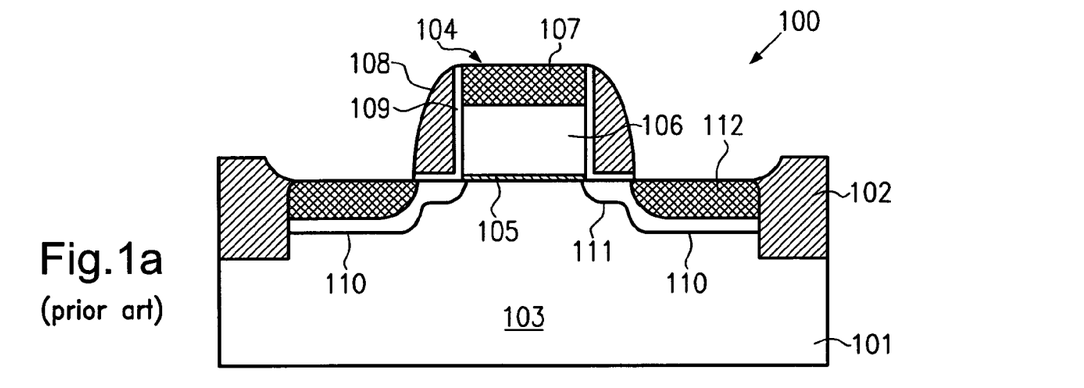
FIGS. 1a and 1b schematically illustrate cross-sectional views of a field effect transistor during various manufacturing stages in accordance with a conventional approach for forming raised drain and source regions.
Figure 1B:
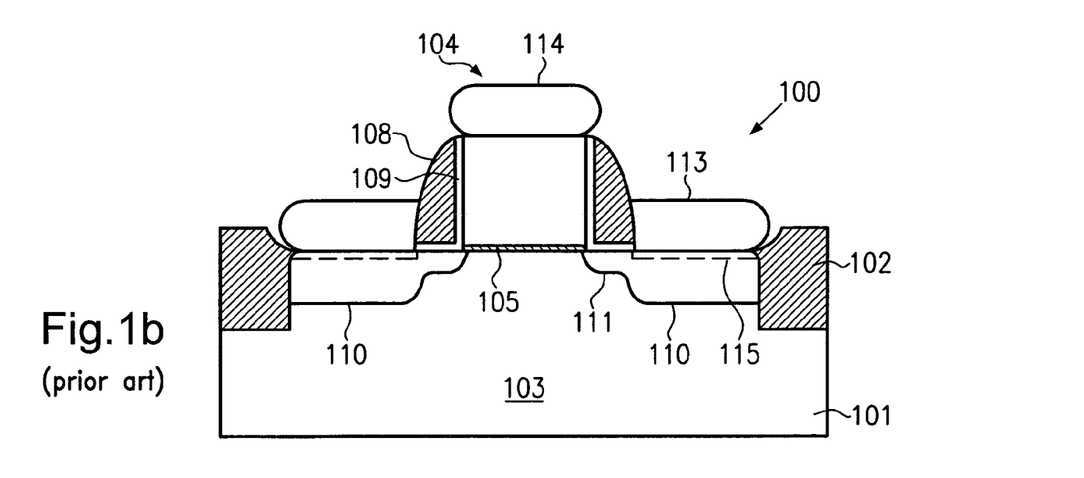

With reference to FIGS. 1a–1b, some of the issues associated with the extreme size reduction of field effect transistors will now be described in more detail. In FIG. 1a, a field effect transistor 100 comprises a substrate 101, for instance, a silicon-substrate or a silicon-on-insulator (SOI) substrate having formed thereon a crystalline silicon region 103 that is frequently referred to as an "active region." The active region 103 is enclosed by an isolation structure 102, which is usually provided in sophisticated transistor elements in the form of a trench isolation structure. A gate electrode 104 is formed above the active region 103 and is separated therefrom by a gate insulation layer 105. The gate electrode 104 may be comprised of doped polysilicon 106 and a metal silicide region 107 that may be comprised of, for instance, cobalt disilicide. Adjacent to the gate electrode 104, sidewall spacers 108 are located and are formed, for instance, of silicon nitride with a liner 109, for instance comprised of silicon dioxide, disposed between the sidewalls of the gate electrode 104 and the upper surface of the active region 103 and the sidewall spacers 108. The active region 103 further comprises source and drain regions 110, wherein the dopant profile towards the gate electrode becomes shallower and corresponding portions 111 are commonly referred to as "extensions." Metal silicide regions 112, typically comprised of cobalt disilicide or nickel silicide in modern transistor elements, are formed within the drain and source regions 110.

A typical process flow for manufacturing the transistor 100 as depicted in FIG. 1a may comprise the following processes. After the formation of the trench isolation structures 102 by sophisticated lithography, etch and deposition techniques followed by a chemical mechanical polishing (CMP) sequence, an implantation cycle may be performed to provide a required vertical dopant profile within the active region 103. Corresponding processes are well established in the art and a detailed description is thus omitted herein. Thereafter, the gate insulation layer 105 may be formed by sophisticated oxidation and/or deposition techniques, followed by the formation of the gate electrode 104, which is typically formed by patterning a polysilicon layer by means of advanced lithography and etch techniques. A first implantation cycle may be carried out to form the extensions 111, and subsequently the liner 109 may be formed by, for example, an oxidation process. Next, the sidewall spacers 108 may be formed to serve as an implantation mask for forming the drain and source regions 110. The actually performed implantation cycles may include a plurality of implantation steps, for instance including tilted implantation sequences, to obtain the required complex dopant profile for the drain and source regions 110 and the extension 111. Thereafter, one or more anneal cycles are carried out to activate the dopants implanted into the active region 103 and to, at least partially, re-crystallize portions of the active region 103 damaged by the preceding ion implantation sequence.

Since relatively high temperatures are necessary to activate the dopants, the anneal cycles are accompanied by increased diffusion of the dopants, thereby significantly affecting the finally obtained dopant profile. As the transistor dimensions are steadily reduced, the final dopant concentrations have to be precisely controlled during the manufacturing process of the transistor 100 to assure the required transistor performance. For instance, as the channel length decreases, i.e., the lateral distance of the extensions 111 in FIG. 1a, extensive lateral diffusion is to be precisely controlled. Thus, a so-called thermal budget is established that sets forth the maximum amount of heat treatments that may be applied to the transistor during fabrication without causing unacceptable diffusion of the various doped regions over time during the manufacturing process of the transistor device 100. Consequently, the thermal budget for the transistor 100 should be maintained as low as possible to not unduly "smear" the dopant profile and, hence, compromise the transistor characteristic.

Thereafter, the silicide regions 112 and 107 (see FIG. 1a) may be formed to significantly lower the contact resistance of the drain and source regions 110 as well as the line resistance of the gate electrode 104. As previously explained, in sophisticated transistor elements, extremely shallow dopant profiles for the extensions 111 and the drain and source regions 110 are required that, in turn, restrict the available depth to which the silicide regions 112 may be formed. Furthermore, since typically the silicide regions 112 and 107 are formed simultaneously in a self-aligned manner, the depth restriction with respect to the silicide regions 112 also affects the finally obtained depth of the region 107 in the gate electrode 104, and thus significantly influences the degree of conductivity improvement achieved in the gate electrode 104.

Typically, a layer of refractory metal, such as cobalt, is deposited and a heat treatment is performed to initiate a chemical reaction, thereby forming, for example, cobalt silicide at device regions containing silicon, whereas a reaction of the refractory metal with the sidewall spacers 108 and the isolation structures 102 is substantially prevented. Thereafter, the non-reacted cobalt is selectively removed and a further heat treatment is performed to convert the relatively high ohmic cobalt silicide into a stable and highly conductive cobalt disilicide.

As explained above, the reduced depth of the drain and source regions 110 may not permit the formation of appropriately sized metal silicide regions 112 and 107 to provide the required low contact resistance and sheet resistance, respectively.

As is shown in FIG. 1b, a different approach is, therefore, frequently employed. Here, prior to the formation of the metal silicide regions 112, 107, an epitaxial growth process is performed to selectively increase the thickness of exposed silicon areas, while substantially not affecting the isolation structure 102 and the sidewall spacers 108. As shown, additional silicon regions 113 are formed above the drain and source regions 110 and a corresponding silicon region 114 may be formed on top of the polysilicon gate electrode 104. Finally, a silicidation process is performed as is described with reference to FIG. 1a, wherein a silicide thickness is no longer restricted by the shallow PN junction in the drain and source regions 110. It turns out, however, that the epitaxial growth as shown in FIG. 1b is sensitively influenced by the surface quality of the drain and source regions 110. It has been found that a moderately large amount of surface defects, for instance dislocation sources, dislocation loops, and the like are present in a surface region 115 of the drain and source regions 110, which may substantially prevent a defect-free growth of the additional silicon regions 113. Conventionally, the transistor 100 may be subjected to an anneal cycle at temperatures above 1000° C. in a hydrogen atmosphere to remove contamination, such as carbon and the like, from the surface region 115 having a depth of approximately a few nanometers. The elevated temperatures applied during the anneal cycle prior to the epitaxial growth process, however, significantly contributes to the thermal budget of the transistor 100. Hence, the anneal process may not be continued so as to also efficiently re-crystallize the surface defects in the region 115. As a consequence, the surface defects remain or are also introduced into the grown regions 113 and may then compromise the transistor performance by acting as diffusion paths for dopants and sites for charge carrier gettering.

In view of the above-identified problems, a need exists to provide an improved technique that enables the formation of raised drain and source regions without unduly deteriorating transistor performance owing to crystalline defects after the selective epitaxial growth.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of raised drain and source regions by epitaxial growth methods, wherein surface defects of the initial substrate are significantly reduced by performing an amorphization implantation and a subsequent anneal process to re-crystallize the substantially amorphized region. The re-crystallization of a substantially amorphous crystalline structure may reproduce the crystalline structure with a significantly reduced number of crystalline defects, thereby also eliminating, or at least significantly reducing, the number of surface defects of the initial substrate layer. In some embodiments, the implantation for amorphizing a portion of the substantially crystalline substrate including surface defects may be performed prior to the epitaxial growth process, which then results in a substantially amorphous grown silicon region that may efficiently be re-crystallized along with the amorphous portion of the substrate by an appropriate anneal process.

According to another illustrative embodiment of the present invention, a method comprises forming doped regions in a crystalline silicon region adjacent to a gate electrode having sidewall spacers formed thereon, wherein at least a first portion of the crystalline silicon region maintains its crystalline structure during the formation of the doped regions. Moreover, a silicon layer is epitaxially grown on the doped regions and an ion species is implanted through the silicon layer and into the doped regions to substantially amorphize the silicon layer and a second portion of the silicon region. Finally, the silicon region and the grown silicon layer are annealed to re-crystallize the second portion of the silicon region and the grown silicon layer.

According to yet another illustrative embodiment of the present invention, the method comprises forming an amorphous region in a crystalline silicon region adjacent to a gate electrode, wherein at least a first portion of the crystalline silicon region maintains its crystalline structure during the formation of the amorphous region. A spacer element is formed on sidewalls of the gate electrode and a silicon layer is epitaxially grown on the amorphous portion, wherein the grown silicon layer has substantially an amorphous structure. Finally, the silicon region and the grown silicon layer are annealed to re-crystallize the amorphous portion of the silicon region and the silicon layer.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that transistor performance of devices having raised drain and source regions including an epitaxially grown silicon layer may be enhanced by reducing the number of interface defects, which result from the epitaxial growth on a substrate surface having a certain amount of surface defects, such as dislocation sites, dislocation loops, contaminating atoms, and the like, which may, contrary to desired dopant impurities, negatively affect the transistor characteristics. For reducing the number of interface defects, the epitaxially grown silicon layer and at least a surface portion of the initial substrate are provided in a substantially amorphous structure, which may then be more effectively re-crystallized by an annealing process, wherein at least the initial surface defects in the form of crystal defects may be substantially reduced due to the re-growth of the crystal that is seeded by deep crystalline regions having a reduced number of crystalline defects.

Figure 2A:
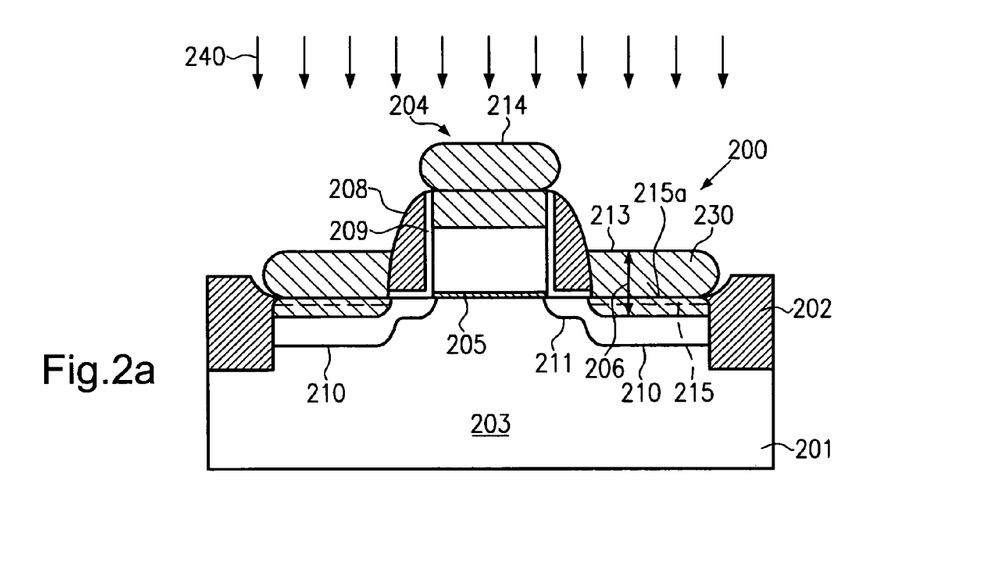
FIGS. 2a–2e schematically show cross-sectional views of a field effect transistor during various manufacturing stages for forming raised source and drain regions with a reduced number of interface defects in accordance with illustrative embodiments of the present invention.

With reference to the drawings, further illustrative embodiments of the present invention will be described in more detail. In FIG. 2a, a transistor element 200 comprises a substrate 201 including a crystalline silicon region 203, which may also be referred to as an "active region." The active region 203 is enclosed by an isolation structure 202, which may be provided in the form of a trench isolation. It should be noted that the substrate 201 may represent a bulk silicon substrate or an SOI substrate having formed thereon a substantially crystalline silicon layer. A gate electrode 204, substantially comprised of polysilicon, is formed above the active region 203 and is separated therefrom by a gate insulation layer 205. Moreover, sidewall spacers 208 including a liner 209 are formed on sidewalls of the gate electrode 204. The transistor 200 further comprises epitaxially grown silicon layers 213 and 214 located on top of an exposed portion of the active region 203 and on top of the gate electrode 204, respectively. Moreover, near an interface 215a, between the epitaxially grown silicon layer 213 and the underlying active region 203, crystalline defects 215, such as dislocation sites, dislocation loops and the like, are present, which may be considered as interface defects after the epitaxial growth of the layer 213. Moreover, doped regions acting as drain and source extension regions 211 and deep drain and source regions 210 are formed in the active region 203 adjacent to the gate electrode 204.

A typical process flow for forming the transistor 200 as shown in FIG. 2a may comprise substantially the same processes as are described with reference to FIGS. 1a-1b. Contrary to the conventional approach, after the epitaxial growth process for forming the silicon layers 214, 213 in a selective manner, the transistor element 200 is subjected to an implantation process 240 to initiate an ion bombardment for substantially amorphizing the layer 213 and a portion of the active region 203 not covered by the gate electrode 204 and the spacers 208. Hereby, the implantation parameters may be selected to achieve a substantial dissolving of the crystalline structure down to a specified depth 206, thereby also substantially dissolving the interface defects 215. In some embodiments, the ion implantation 240 may be performed on the basis of heavy inert ions, such as xenon, krypton, or any other noble gas ions, wherein the dose, implantation energy, and implantation time may be selected to achieve the desired degree of amorphization in a second portion 230 defined by the depth 206 and including the region of the interface defects 215. The ion implantation is performed such that a first portion 231 located below the second portion 230 substantially maintains its crystalline structure. Controlling the depth 206 of the second portion 230 may readily be accomplished by selecting an appropriate implantation energy for the ion species under consideration and for a given thickness of the epitaxially grown silicon layer 213, which may be known with a sufficient accuracy from the epitaxial growth parameters. The precise depth 206 of the second portion 230 is not critical as long as electrically inactive ions are used for the ion bombardment and the interface defects 215 are efficiently dissolved during the ion bombardment. In other embodiments, the ion implantation 240 may be performed on the basis of silicon ions, which may also be considered as an inert species.

In one embodiment, a dopant species providing a desired conductivity type may be introduced by the ion implantation 240 in such a way that severe crystal damage is created, at least at the interface 215*a*. This may be advantageous if a high dopant concentration is desired at the interface 215*a* within the source and drain regions 210.

Figure 2B:
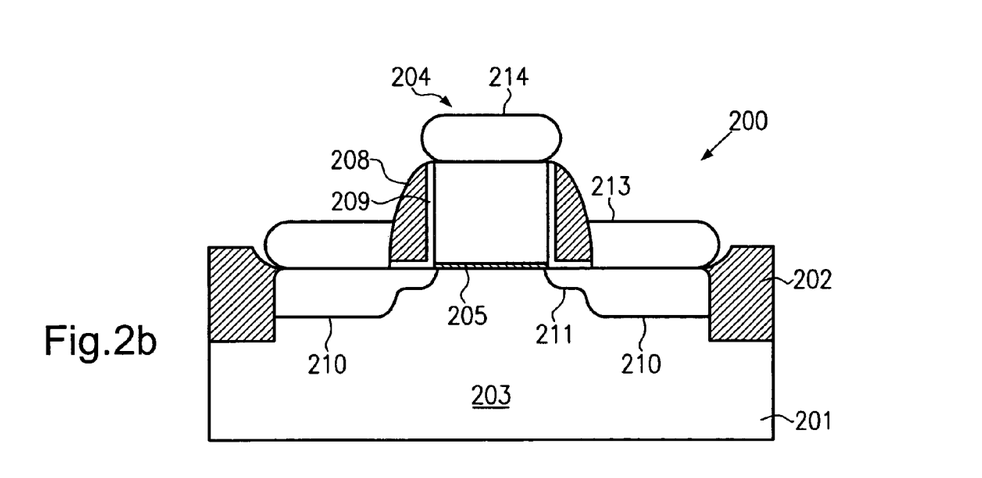

FIG. 2*b* schematically shows the transistor element 200 after the ion implantation 240 and a subsequent anneal process, such as a rapid thermal anneal process, during which a re-crystallization of the second portion 230 is achieved, wherein the re-crystallization process is initiated by deep crystalline portions of the active region 203 below the portion 230 that comprises the first portion 231 and typically have a significantly reduced number of crystalline defects so that the crystalline re-arrangement within the portion 230 may no longer contain the high number of interface defects 215. After the re-crystallization of the second portion 230, the process sequence may be continued by forming corresponding metal silicide regions (not shown) by well-established processes, as is described, for instance, with reference to FIG. 1*a*.

In some cases, the selective growth of the silicon layer 214 on top of the gate electrode 204 may be considered inappropriate due to device requirements or due to issues in the further manufacturing process that may be related to insufficient coverage during an interlayer dielectric deposition process and the like. This leads one to consider a capping layer, e.g., a capping layer as detailed below with reference to FIG. 2*c*. Moreover, in some approaches, as will be described later on, disposable spacers may be used that may be removed after the epitaxial growth, wherein the silicon layer 214 may negatively affect the removal process and the further formation sequence of other sidewall spacers.

Figure 2C:
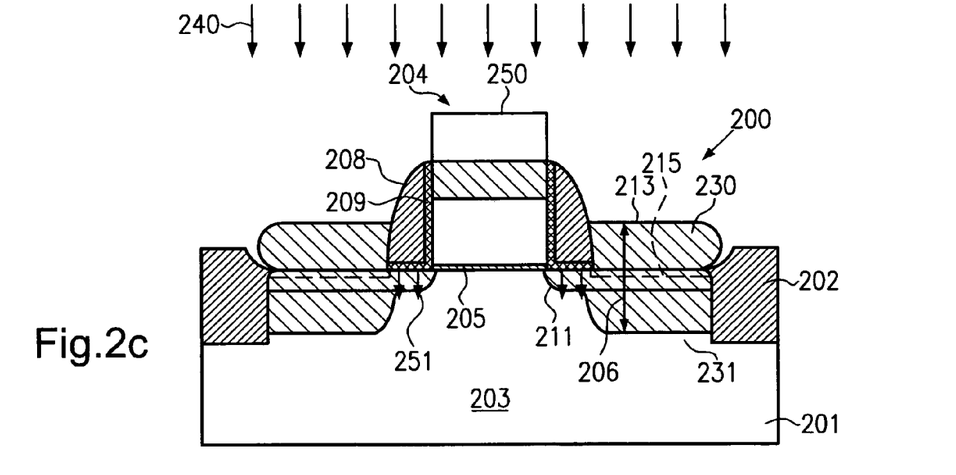

FIG. 2*c* schematically shows the transistor element 200, in which the gate electrode 204 has formed thereon a capping layer 250, which may be comprised of silicon oxynitride, silicon nitride and the like. In one particular embodiment, the capping layer 250 may represent the residue of an anti-reflective coating (ARC) layer used during the patterning of the gate electrode 204. Due to the capping layer 250, epitaxially grown silicon layers are formed on top of the exposed active region 203 only in the form of the layers 213. According to another embodiment, the extension regions 211 are formed in the active region 203, while deep drain and source regions are not yet implanted. The transistor 200 as shown in FIG. 2*c* is then subjected to the ion implantation 240 for introducing an appropriate inert species to create the substantially amorphized portion 230, as is also described with reference to FIG. 2*a*. It should be noted that in other embodiments, similarly as in FIG. 2*a*, corresponding deep drain and source regions may have been formed prior to the formation of the substantially amorphized portion 230, as is described with reference to FIG. 2*a*. In the embodiment shown in FIG. 2*c*, the depth 206 may be selected to exceed an intended depth of the deep source and drain regions still to be formed. As previously explained, corresponding implantation parameters may be readily selected on the basis of well-established simulation calculations. Due to the ion implantation 240, the surface defects 215, initially present at the surface of the active region 203, may effectively be dissolved during the amorphization of the second portion 230.

Figure 2D:
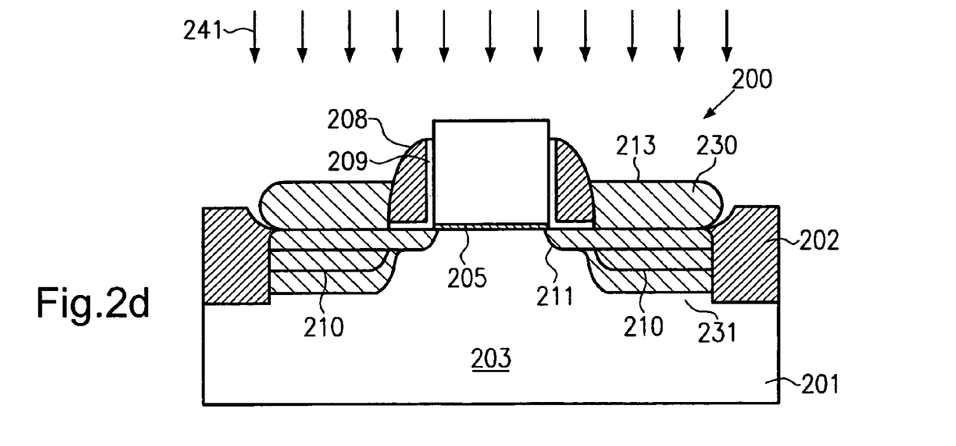

FIG. 2*d* schematically shows the transistor 200 when being subjected to a further ion implantation 241 for introducing a dopant species creating deep drain and source regions 210. Since, in some embodiments, the depth 206 is selected to exceed the depth of the deep drain and source regions 210, the dopant species is implanted during the implantation 241 through the substantially amorphized portion 230 so that channeling effects, that is, the propagation of dopant ions along crystallographic axes with significantly reduced interaction and thus stopping power, are significantly suppressed, thereby resulting in an improved dopant profile for the deep source and drain regions 210. Prior to or after the implantation 241, the capping layer 250 may be removed, for instance by a selective etch process, during which the sidewall spacers 208 may also be recessed. Thereafter, any residues of the liner 209 may be selectively removed to provide an increased surface area of the gate electrode 204 for a silicidation process that is to be performed later on. After the implantation 241, a correspondingly designed anneal process may be performed to re-crystallize the second portion 230 and also activate the dopants in the deep drain and source regions 210 and possibly in the extension regions 211 if a corresponding anneal process for activating the extension regions has not been performed.

It should be noted in this respect that the extension regions 211 may be formed, in accordance with one embodiment, prior to the formation of the sidewall spacers 208 by a corresponding implantation process without a subsequent anneal process, wherein the implantation process may produce a high number of crystalline defects so that the number of surface defects 215 is significantly increased compared to embodiments in which an anneal process is performed after the implantation process for forming the extension regions 211. Accordingly, an increased number of interface defects may be created during the selective epitaxial growth, which are then also effectively dissolved by the implantation 240 when substantially amorphizing the portion 230. By avoiding an anneal process for activating the dopants after the extension implantation, the total thermal budget for the transistor device 200 may be tightened. Moreover, typically a re-crystallization of a substantially amorphous silicon portion may be accomplished with a reduced anneal time or a reduced anneal temperature compared to an activation of dopants and a corresponding repair of crystal damage caused by a deep source/drain implantation without providing the substantially amorphized portion 230. Hence, the interface defects 215 may effectively be reduced while at the same time the dopant profile of the extension regions 211 and the deep drain and source regions 210 may be less affected by the anneal process for activating the dopants.

Figure 2E:
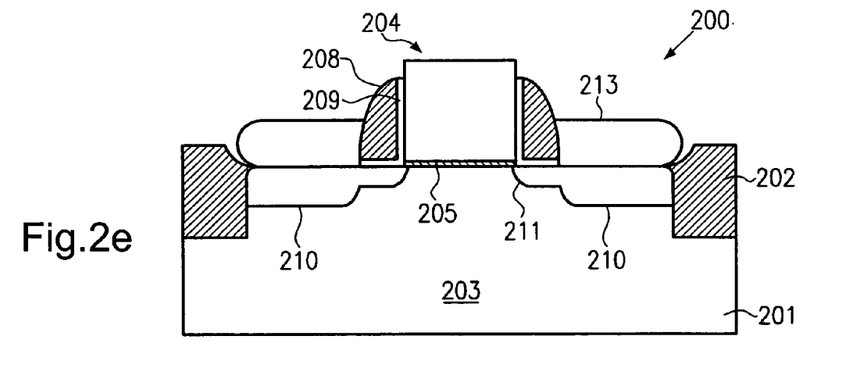

FIG. 2*e* schematically shows the semiconductor device 200 after the anneal cycle, wherein the second portions 230 are substantially re-crystallized. Thereafter, the manufacturing process may be continued with the formation of metal silicide regions in the gate electrode 204 and the silicon layers 213 in accordance with design requirements.

In a further illustrative embodiment, and again referring to FIG. 2*c*, the extension regions 211 may be formed by a diffusion process, wherein, for example, the liner 209 is deposited with a moderately high concentration of a specified dopant species 251, which may then be partially driven into the active region 203 by a heat treatment. In other embodiments, the dopant species may also be provided in the sidewall spacers 208, for instance, by depositing a corresponding spacer layer including a required high concentration of the dopant species 251. The dopant species 251 may then be driven into the active region 203 during a subsequent heat treatment, or during the anneal process for re-crystallizing the second portion 230 (FIG. 2*d*), thereby preferably introducing the dopant species 251 into the area below the sidewall spacers 208. In the latter case, that is, driving the dopants 251 into the region 203 during the re-crystallization anneal, it is advantageous to also provide a high concentration of the dopants 251 within the sidewall spacer 208 to avoid undue out-diffusion of the dopants 251 into the spacers 208 rather than into the region 203. It should be noted that a certain degree of diffusion also takes place during the selective epitaxial growth process, since here moderately high temperatures of approximately 700–1000° C. are required. Consequently, the heat treatment during the epitaxial growth in combination with an anneal process that is specifically designed to re-crystallize the second portion 230 and activate the dopants in the deep drain and source regions 210, as well as in the extension regions 211, may be sufficient to obtain the desired extension dopant profile without requiring a specific heat treatment for introducing the dopants 251 into the active region 203.

Figure 3A:
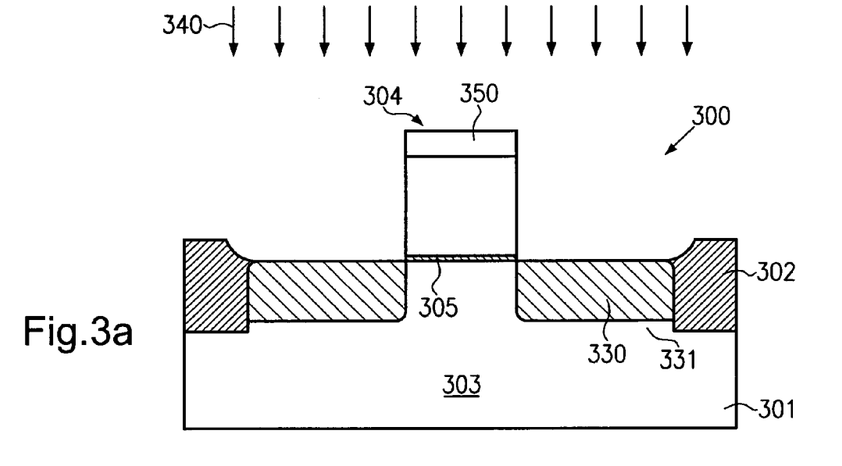
FIGS. 3a–3c schematically show cross-sectional views of a field effect transistor during various manufacturing stages, wherein an amorphizing implantation is performed prior to a selective epitaxial growth in accordance with further illustrative embodiments, and FIGS. 4a–4d schematically show cross-sectional views of a transistor element during various manufacturing stages, wherein the source and drain implantations are performed after an amorphization of an epitaxially grown silicon region in accordance with further illustrative embodiments.

With reference to FIGS. 3a–3c, further embodiments will be described, wherein any surface defects are dissolved prior to the epitaxial growth. FIG. 3a schematically shows a transistor element 300 that comprises a substrate 301 including a substantially crystalline silicon region 303 that is enclosed by an isolation structure 302. Regarding the substrate 301 and the silicon region 303, the same criteria apply as previously set forth with respect to the transistor elements 100 and 200. A gate electrode 304 is formed above the active region 303 and is separated therefrom by a gate insulation layer 305. A capping layer 350 covers the top surface of the gate electrode 304. The capping layer 350 may represent, for example, the residue of an anti-reflective coating (ARC) layer comprised of silicon oxynitride.

The formation of the gate electrode 304 and the isolation structure 302 may include substantially the same processes as previously described with reference to FIGS. 1a and 2a. Thereafter, the transistor 300 may be subjected to an ion implantation 340 to form a substantially amorphized second portion 330 within the active region 303 while substantially maintaining the crystalline structure of a first portion 331 located below the second portion 330. The ion implantation 340 may preferably be performed with a heavy inert ion species, such as xenon or other noble gas ions, or with silicon.

Figure 3B:
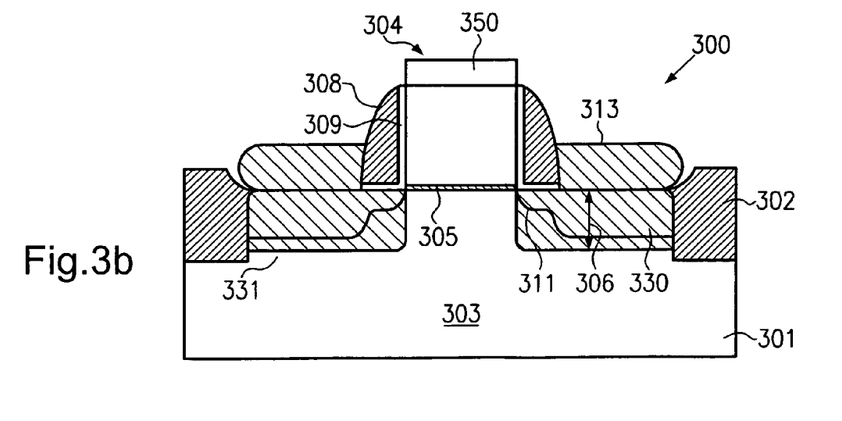

FIG. 3b schematically shows the transistor 300 with an epitaxially grown silicon layer 313 formed on the substantially amorphized second portion 330. Moreover, extension regions 311 and deep drain and source regions 310 are formed in the active region 303. In one particular embodiment, a depth 306 is selected such that the deep drain and source regions 310 are located within the substantially amorphized second portions 330. Furthermore, sidewall spacers 308 including a liner 309 are formed on sidewalls of the gate electrode 304.

A typical process flow for forming the transistor element 300 as shown in FIG. 3b may comprise the following processes. In one illustrative embodiment, the extension regions 311 may be formed by ion implantation, possibly assisted by any offset spacers (not shown). Thereafter, the sidewall spacer 308 may be formed, followed by an implantation process for forming the deep drain and source regions 310. As previously discussed, the implantation of the dopant species into the substantially amorphized portion 330 significantly reduces any channeling effects and thus helps in achieving an improved lateral and vertical dopant profile. Thereafter, a selective epitaxial growth process may be performed wherein, due to the lack of a crystalline surface, the silicon deposited during the epitaxial growth process is substantially amorphous. Consequently, the portion 330 substantially lacks any surface defects so that any interface defects, such as the defects 215 (FIG. 2b) may be substantially avoided. Moreover, during the epitaxial growth process, the gate electrode 304 is covered by the capping layer 350 so that process parameters may be adjusted to provide a sufficient adhesion of silicon atoms on the substantially amorphous surface of the second portion 330 without risking an undue deposition of silicon on the capping layer 350 and the isolation structures 302.

In a further illustrative embodiment, the implantation process for forming the deep drain and source regions 310 may be performed after the epitaxial growth process, thereby eliminating dopant diffusion out of the deep drain and source regions 310 during the epitaxial growth process.

Figure 3C:
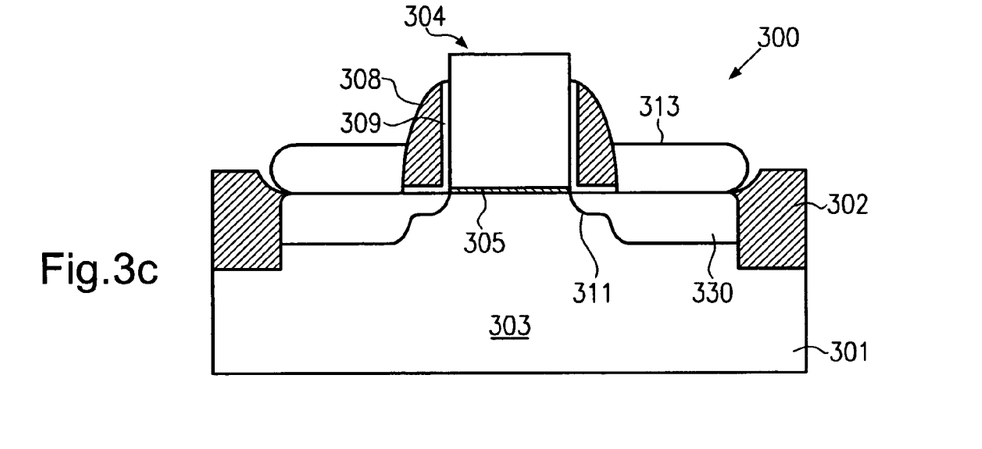

FIG. 3c schematically shows the transistor element 300 after the removal of the capping layer 350 and a portion of the sidewall spacer 308. Moreover, the second portion 330 and the epitaxially grown silicon layer 313 are re-crystallized by a corresponding anneal process, during which the dopants of the extension regions 311 and the deep drain and source regions 310 may also be activated. The removal of the capping layer 350 may be performed prior to or after the anneal process for re-crystallizing the portion 330 and the layer 313. The further processing may be continued by forming corresponding metal silicide regions on top of the gate electrode 304 and within the silicon layer 313 and possibly within the drain and source regions 310.

Figure 4A:
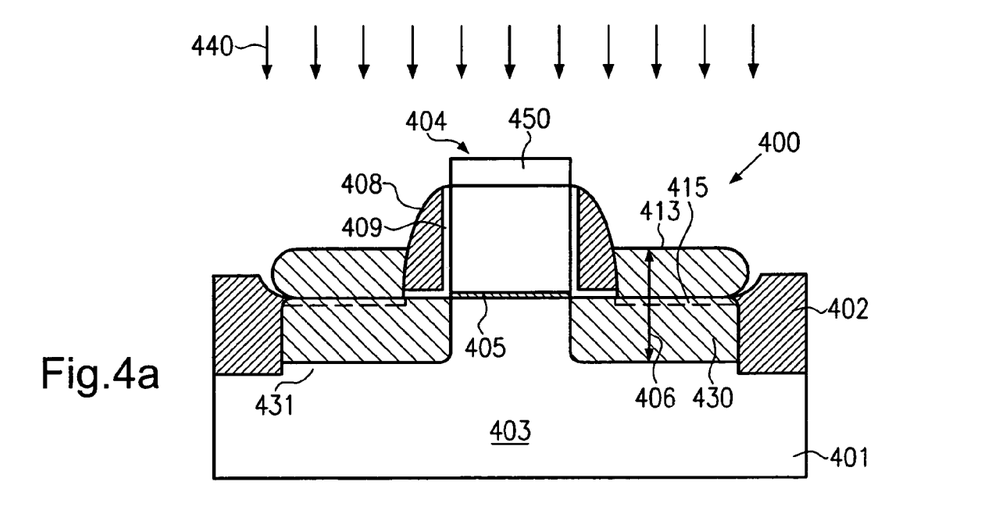

With reference to FIGS. 4a–4d, further illustrative embodiments of the present invention will now be described. In FIG. 4a, a transistor element 400 comprises a substrate 401 having formed thereon an active region 403, which is enclosed by an isolation structure 402. A gate electrode 404 having formed thereon a spacer element 408 including a liner 409 is formed above the active region 403 and is separated therefrom by a gate insulation layer 405. The gate electrode 404 is covered by a capping layer 450. Epitaxially grown silicon layers 413 are formed over exposed areas of the active region 403. Moreover, the surface area of the active region 403 may contain a plurality of surface defects 415.

A typical process flow for forming the transistor device 400 as shown in FIG. 4a may include substantially the same processes as previously described with reference to FIGS. 1a, 2a, and 3a, with the exception that implantation processes for forming extension regions and deep drain and source regions are not performed. Hence, after the completion of the epitaxially grown silicon layer 413, the device 400 is subjected to an ion implantation 440 on the basis of a heavy inert ion species, or on the basis of silicon and the like, thereby substantially amorphizing a second portion 430 located above a substantially crystalline first portion 431 within the silicon layer 413 and the active region 403. Advantageously, implantation parameters of the process 440 are selected such that a depth 406 exceeds a depth that is specified for a deep drain and source region.

Figure 4B:
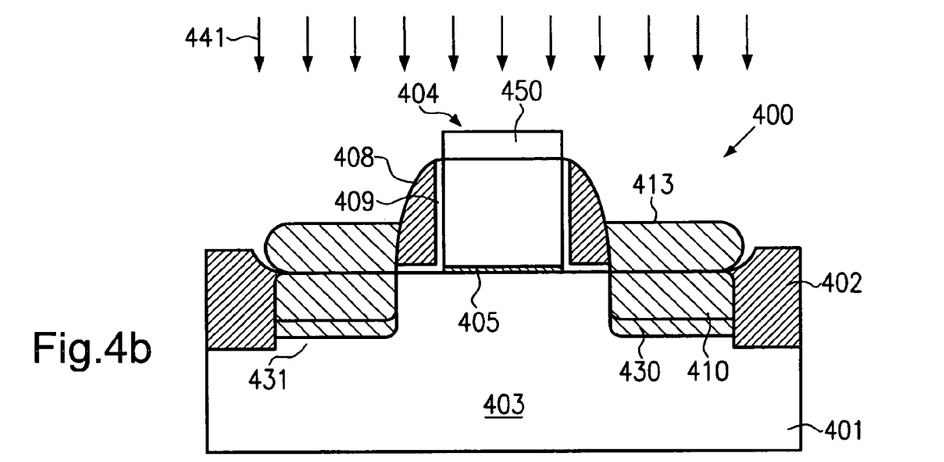

FIG. 4b schematically shows the transistor element 400 during a further ion implantation 441 for introducing a specified dopant species through the substantially amorphized silicon layer 413 and into the second portion 430 using the gate electrode 404 and the spacers 408 as an implantation mask. It should be noted that the spacers 408, although they may serve as disposable spacers, are designed to obtain a desired lateral dopant profile for deep drain and source regions 410, which are formed by the ion implantation 441. As previously noted, due to the substantial amorphization of the second portion 430, any channeling effects are significantly suppressed, thereby also improving the finally obtained dopant profile of the deep drain and source regions 410. Thereafter, the spacer 408 may be removed, for instance by a highly selective wet chemical etch process, during which also the capping layer 450 may be removed. Next, the liner 409 may be removed, for example, by a corresponding selective wet chemical etch process.

Figure 4C:
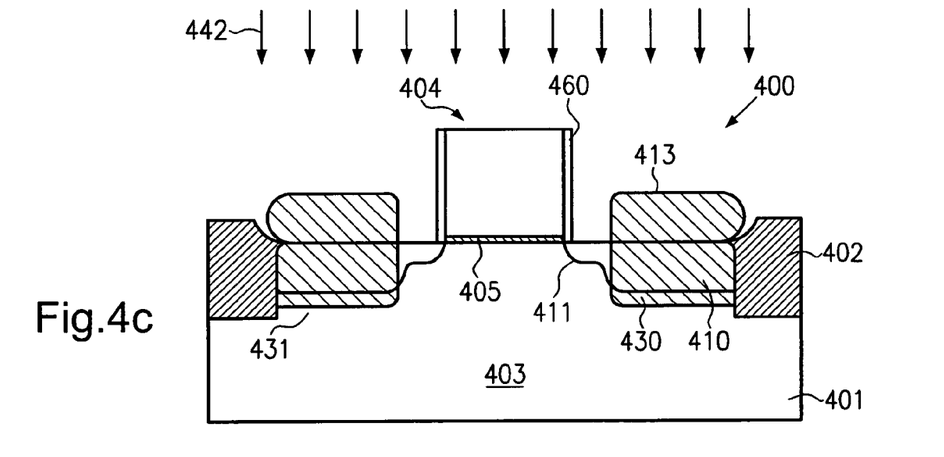

FIG. 4c schematically shows the transistor 400 after the removal of the sidewall spacer 408 and the liner 409, and during a further implantation process 442, which may be masked by an offset spacer 460 comprised of, for example, silicon dioxide. The offset spacer 460 is dimensioned to obtain a desired lateral dopant profile for extension regions 411. Thereafter, an anneal process may be performed to re-crystallize the second portion 430 and the silicon layer 413, thereby also activating the dopants in the extension regions 411 and the deep drain and source regions 410.

Figure 4D:
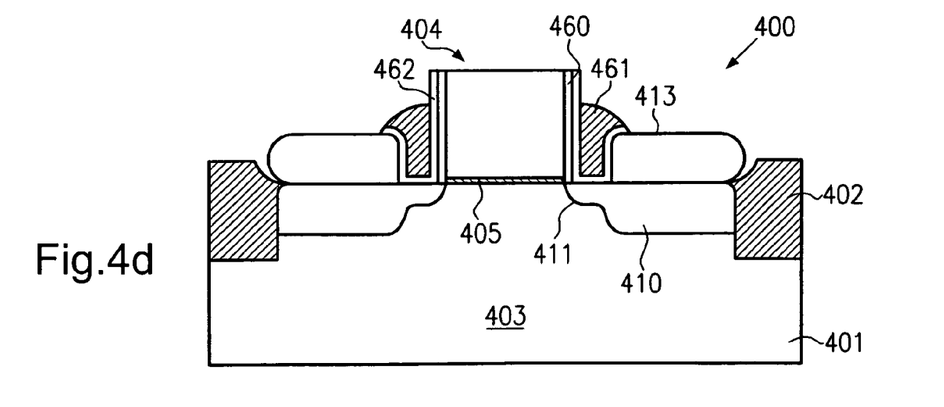

FIG. 4d schematically shows the transistor element 400 with a further spacer element 461 including a liner 462 formed on portions of the sidewall of the gate electrode 404. The spacer 461 and the liner 462 may be formed in accordance with well-established spacer techniques and may be designed such that the requirements of a subsequent silicidation process are met. Hence, due to the amorphization of the portion 430 and the epitaxially grown silicon layer 413, the number of interface defects finally obtained in the device of FIG. 4d may be significantly reduced compared to the situation shown in FIG. 4a, thereby significantly enhancing transistor performance. Moreover, the activation of the dopants in the extension regions 411 and the deep drain and source regions 410 may be performed more efficiently due to the pre-amorphization, which, as previously discussed, allows a re-crystallization with reduced temperature and/or duration compared to curing crystal defects that are created by dopant implantation into a crystalline substrate without a pre- or post-amorphization.

It should be further noted that the spacer 408 (FIGS. 4a and 4b) may be designed to merely meet the requirements for a selective epitaxial growth, i.e., for adjusting the distance between the silicon layer 413 and the gate electrode 404, without having dimensions to also act as an implantation mask. In this case, the spacer 408 may be removed after the selective epitaxial growth of the silicon layer 413, and thereafter extension implantation, spacer formation, and deep source and drain implantation may be performed, as is described with reference to FIGS. 2a–2e and 3a–3d.

As a result, the present invention provides a technique for reducing interface defects between a selectively epitaxially grown silicon layer and an underlying silicon substrate surface by substantially amorphizing the substrate surface and/or the silicon region by means of a specifically designed ion implantation. In particular embodiments, the implantation for substantially amorphizing the substrate surface is performed after the selective epitaxial growth of the silicon layer, thereby substantially amorphizing the silicon layer and any interface region, whereby interface defects are also effectively dissolved and reduced. Thus, transistor performance of devices having raised drain and source regions with selectively epitaxially grown portions may be enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming doped regions in a crystalline silicon region adjacent to a gate electrode having sidewall spacers formed thereon, a first portion of said crystalline silicon region maintaining its crystalline structure during the formation of said doped regions, wherein forming said doped regions comprises implanting a dopant species into said silicon region prior to forming said sidewall spacers to form source and drain extension regions;
   epitaxially growing a silicon layer on said doped regions;
   implanting an ion species through said silicon layer and into said doped regions to substantially amorphize said silicon layer and a second portion of said silicon region; and
   annealing said silicon region and said grown silicon layer to re-crystallize said second portion of said silicon region and said silicon layer.

2. The method of claim 1, wherein said ion species is a noble gas species.

3. The method of claim 1, wherein said ion species comprises silicon ions.

4. The method of claim 1, wherein forming doped regions comprises introducing a dopant species into said crystalline silicon region by ion implantation.

5. The method of claim 4, further comprising activating said dopant species by an anneal process.

6. The method of claim 5, wherein said dopant species is activated during annealing said silicon region and said grown silicon layer.

7. The method of claim 1, wherein said silicon layer is selectively grown on exposed silicon surfaces.

8. The method of claim 1, wherein said ion species comprises a dopant species.

9. The method of claim 1, further comprising forming a capping layer on a top surface of said gate electrode prior to growing said silicon layer.

10. The method of claim 1, wherein forming said doped regions comprises introducing a dopant species into said silicon region by diffusing said dopant species into said silicon region.

11. The method of claim 1, further comprising implanting a second dopant species through said silicon layer after implanting said ion species and prior to annealing said silicon region and said silicon layer.

12. A method, comprising:
   forming an amorphous region in a crystalline silicon region adjacent to a gate electrode, at least a first portion of said crystalline silicon region maintaining its crystalline structure during the formation of said amorphous region;
   forming a spacer element on sidewalls of said gate electrode;
   epitaxially growing a silicon layer on said amorphous portion, said grown silicon layer having a substantially amorphous structure;
   annealing said silicon region and said grown silicon layer to re-crystallize said amorphous portion of the silicon region and said silicon layer; and
   forming source and drain regions by implanting a dopant species into said amorphous region, wherein forming said source and drain regions comprises performing a first implantation process prior to forming said spacer element to form source and drain extension regions and performing a second implantation process after forming said spacer element.

13. A method, comprising:

forming doped regions in a crystalline silicon region adjacent to a gate electrode having sidewall spacers formed thereon, a first portion of said crystalline silicon region maintaining its crystalline structure during the formation of said doped regions;

epitaxially growing a silicon layer on said doped regions;

implanting an ion species through said silicon layer and into said doped regions to substantially amorphize said silicon layer and a second portion of said silicon region; and annealing said silicon region and said grown silicon layer to re-crystallize said second portion of said silicon region and said silicon layer, wherein said dopant species is activated during annealing said silicon region and said grown silicon layer.

14. A method, comprising:

forming doped regions in a crystalline silicon region adjacent to a gate electrode having sidewall spacers formed thereon, a first portion of said crystalline silicon region maintaining its crystalline structure during the formation of said doped regions;

epitaxially growing a silicon layer on said doped regions;

implanting an ion species through said silicon layer and into said doped regions to substantially amorphize said silicon layer and a second portion of said silicon region, wherein said ion species comprises a dopant species; and annealing said silicon region and said grown silicon layer to re-crystallize said second portion of said silicon region and said silicon layer.

15. A method, comprising:

forming doped regions in a crystalline silicon region adjacent to a gate electrode having sidewall spacers formed thereon, a first portion of said crystalline silicon region maintaining its crystalline structure during the formation of said doped regions;

epitaxially growing a silicon layer on said doped regions;

implanting an ion species through said silicon layer and into said doped regions to substantially amorphize said silicon layer and a second portion of said silicon region;

annealing said silicon region and said grown silicon layer to re-crystallize said second portion of said silicon region and said silicon layer; and forming a capping layer on a top surface of said gate electrode prior to growing said silicon layer.

16. A method, comprising:

forming doped regions in a crystalline silicon region adjacent to a gate electrode having sidewall spacers formed thereon, a first portion of said crystalline silicon region maintaining its crystalline structure during the formation of said doped regions, wherein forming said doped region comprises forming said sidewall spacers to contain a dopant species and introducing said dopant species by diffusing said dopant species into said silicon region by a heat treatment to form source and drain extension regions;

epitaxially growing a silicon layer on said doped regions;

implanting an ion species through said silicon layer and into said doped regions to substantially amorphize said silicon layer and a second portion of said silicon region; and annealing said silicon region and said grown silicon layer to re-crystallize said second portion of said silicon region and said silicon layer.

17. The method of claim 16, further comprising implanting a second dopant species through said silicon layer after implanting said ion species and prior to annealing said silicon region and said silicon layer.

18. A method, comprising:

forming an amorphous region in a crystalline silicon region adjacent to a gate electrode, at least a first portion of said crystalline silicon region maintaining its crystalline structure during the formation of said amorphous region;

forming a spacer element on sidewalls of said gate electrode;

epitaxially growing a silicon layer on said amorphous portion, said grown silicon layer having a substantially amorphous structure;

annealing said silicon region and said grown silicon layer to re-crystallize said amorphous portion of the silicon region and said silicon layer; and forming source and drain regions by implanting a dopant species into said amorphous region, wherein forming source and drain regions comprises removing said spacer element, performing a first implantation process to form source and drain extension regions, forming a second spacer element and performing a second implantation process.

19. A method, comprising:

forming an amorphous region in a crystalline silicon region adjacent to a gate electrode, at least a first portion of said crystalline silicon region maintaining its crystalline structure during the formation of said amorphous region;

forming a spacer element on sidewalls of said gate electrode;

epitaxially growing a silicon layer on said amorphous portion, said grown silicon layer having a substantially amorphous structure;

annealing said silicon region and said grown silicon layer to re-crystallize said amorphous portion of the silicon region and said silicon layer; and forming source and drain regions by implanting a dopant species into said amorphous region, wherein forming source and drain regions comprises performing a first implantation process to form deep source and drain regions, removing said spacer element and performing a second implantation process to form source and drain extension regions.

* * * * *